United States Patent
Wu et al.

(10) Patent No.: US 11,526,978 B2
(45) Date of Patent: Dec. 13, 2022

(54) IMAGE PROCESSING METHOD FOR LIGHT EMITTING DEVICE

(71) Applicant: MPI CORPORATION, Chu-Pei (TW)

(72) Inventors: Ping-Ying Wu, Chu-Pei (TW); Yung-Chin Liu, Chu-Pei (TW)

(73) Assignee: MPI CORPORATION, Chu-Pei (TW)

( * ) Notice: Subject to any disclaimer, the term of this patent is extended or adjusted under 35 U.S.C. 154(b) by 217 days.

(21) Appl. No.: 17/117,513

(22) Filed: Dec. 10, 2020

(65) Prior Publication Data

US 2021/0183047 A1 Jun. 17, 2021

Related U.S. Application Data

(60) Provisional application No. 62/948,186, filed on Dec. 13, 2019.

(30) Foreign Application Priority Data

Sep. 23, 2020 (TW) .................................. 109132993

(51) Int. Cl.
*G06T 7/00* (2017.01)
*G06T 3/00* (2006.01)
*G01N 21/95* (2006.01)
*G01N 21/88* (2006.01)

(52) U.S. Cl.
CPC ....... *G06T 7/0004* (2013.01); *G01N 21/8851* (2013.01); *G01N 21/9501* (2013.01); *G06T 3/0056* (2013.01); *G01N 2021/8887* (2013.01); *G06T 2207/20221* (2013.01); *G06T 2207/30108* (2013.01)

(58) Field of Classification Search
CPC ................. G06T 7/0004; G06T 3/0056; G06T 2207/20221; G06T 2207/30108; G06T 3/4038; G01N 21/8851; G01N 21/9501; G01N 2021/8887; G01N 21/95; G01N 21/956; G01J 1/0418; G01J 2001/4252; G01J 1/4228; G01J 1/42; G01R 31/2635; H01L 22/12; H01L 22/20
See application file for complete search history.

(56) References Cited

U.S. PATENT DOCUMENTS

2014/0362176 A1* 12/2014 St. Clair ................ H04N 5/232
348/36
2018/0357460 A1* 12/2018 Smith ................ G06V 40/1335

* cited by examiner

*Primary Examiner* — Roy M Punnoose
(74) *Attorney, Agent, or Firm* — Birch, Stewart, Kolasch & Birch, LLP

(57) ABSTRACT

An image processing method includes the steps of lighting up at least a part of light emitting units of a light emitting device; capturing a plurality of detection images corresponding to a plurality of sections of the light emitting device respectively, wherein each section includes a plurality of lighted-up light emitting units, each detection image includes a plurality of light spots respectively corresponding to the light emitting units of the associated section, and every two adjacent sections have an overlap area including at least one lighted-up light emitting unit; and stitching the detection images of the adjacent sections together by taking the light spots corresponding to at least one lighted-up light emitting unit of the overlap area as alignment reference spots, so that the light emitting statuses of all the light emitting units are presented by a single image.

15 Claims, 4 Drawing Sheets

IMAGE PROCESSING METHOD FOR LIGHT EMITTING DEVICE

CROSS REFERENCE TO RELATED APPLICATIONS

This non-provisional application claims the benefit under 35 U.S.C. § 119(e) to U.S. Provisional Application No. 62/948,186, filed on Dec. 13, 2019, and under 35 U.S.C. § 119(a) to Patent Application No. 109132993, filed in Taiwan on Sep. 23, 2020, all of which are hereby expressly incorporated by reference into the present application.

BACKGROUND OF THE INVENTION

1. Field of the Invention

The present invention relates generally to test technology for light emitting devices and more particularly, to an image processing method for a light emitting device.

2. Description of the Related Art

The conventional light emitting element, such as micro light-emitting diode (also referred to as 'micro LED' hereinafter) array chip, vertical-cavity surface-emitting laser array chip (also referred to as 'VCSEL chip' hereinafter), and so on, emits light in a way that many tiny light emitting units thereof, such as light outputting holes of the VCSEL chip or respective micro LEDs of the micro LED array chip, emit light at the same time. The light emitting units may be spatially arranged irregularly and have different light-emitting intensities, so that the aforementioned light emitting element may not emit light uniformly. Therefore, the test for the light emitting element usually includes light distribution detection for detecting whether the uniformity of the light distribution of the light emitting element is acceptable.

The conventional light distribution detection is performed by using a camera to capture the image of a device under test including one or more aforementioned light emitting elements when the device under test emits light, thereby capturing the image of the light emitting units invisible to the naked eye. That means the detection image will show light spots corresponding to the light emitting units which emit light. The light spots may be different in the brightness thereof, depending on the light intensities of the light emitting units corresponding thereto. That means the detection image will show relatively brighter light spots and relatively darker light spots, and may even correspondingly show the brightness values of the light spots. The user determines the light distributive status of the device under test by observing the detection image.

However, the current device under tests are developed with larger and larger dimension, resulting in that the size of the device under test may be larger than the field of view (also referred to as 'FOV' hereinafter) of a general image capturing device. In an alternate, the image capturing lens must be very close to the device under test to capture the image of the tiny light emitting units of the device under test, so that the range, the image of which the image capturing device can capture, only covers a part of the device under test. In such condition, although the device under test can be divided into multiple areas for successive detections, it cannot let the user to observe the light emitting statues of all light emitting units of the same device under test at the same time, which is unfavorable for determining the light distributive status of the device under test.

SUMMARY OF THE INVENTION

The present invention has been accomplished in view of the above-noted circumstances. It is an objective of the present invention to provide an image processing method for a light emitting device, which can present the light emitting statuses of all light emitting units of the same light emitting device by a single image.

To attain the above objective, the present invention provides an image processing method for a light emitting device, which uses an image capturing device to capture the images of a plurality of light emitting units of the light emitting device. A field of view of the image capturing device is smaller than the distributive range of the light emitting units of the light emitting device. The image processing method for the light emitting units of the light emitting device includes the steps of:

lighting up at least a part of the light emitting units of the light emitting device;

using the image capturing device to capture the images of a plurality of sections of the light emitting device respectively to obtain a plurality of detection images corresponding to the sections respectively, wherein each of the sections includes a plurality of the lighted-up light emitting units; each of the detection images includes a plurality of light spots respectively corresponding to the light emitting units of associated said section; every two adjacent sections have an overlap area; the overlap area includes at least one of the lighted-up light emitting units; and stitching the detection images corresponding to the adjacent sections together by taking the light spots corresponding to the at least one of the lighted-up light emitting units of the overlap area as alignment reference spots.

In an embodiment of the present invention, after the light emitting units of the light emitting device are at least partially lighted up, the field of view of the image capturing device firstly covers a first section of the light emitting device, which includes a plurality of the lighted-up light emitting units, such that the first section is shot by the image capturing device and hence a first detection image, which includes a plurality of first light spots, is obtained. Then, the field of view of the image capturing device covers a second section of the light emitting device, which includes a plurality of the lighted-up light emitting units, such that the second section is shot by the image capturing device and hence a second detection image, which includes a plurality of second light spots, is obtained. Besides, the first section and the second section have an overlap area which includes at least one of the lighted-up light emitting units. By taking at least one pair of first and second light spots respectively existing in the first and second detection images and corresponding to the same light emitting unit as alignment reference spots, the first and second detection images are stitched together to make the first and second light spots corresponding to respective light emitting units of the overlap area superimposed. Depending on the area of the distributive range of the light emitting units of the light emitting device, the aforementioned image taking and stitching way can be used to further obtain a third detection image corresponding to a third section of the light emitting device (the second and third sections have another overlap area), a fourth detection image corresponding to a fourth section (the third and fourth sections have still another overlap area), and so on, and then further stitch the third detection image to the second detection image, the fourth detection image to the third detection image, and so on.

As a result, by the image processing method for the light emitting units of the light emitting device of the present invention, the segmented images of the same light emitting device, which are captured successively, can be stitched together to become a single, panoramic image, so that the light emitting statuses of all light emitting units of the same light emitting device can be further presented on a single panoramic image, facilitating user's observation of the light distributive status of the light emitting device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
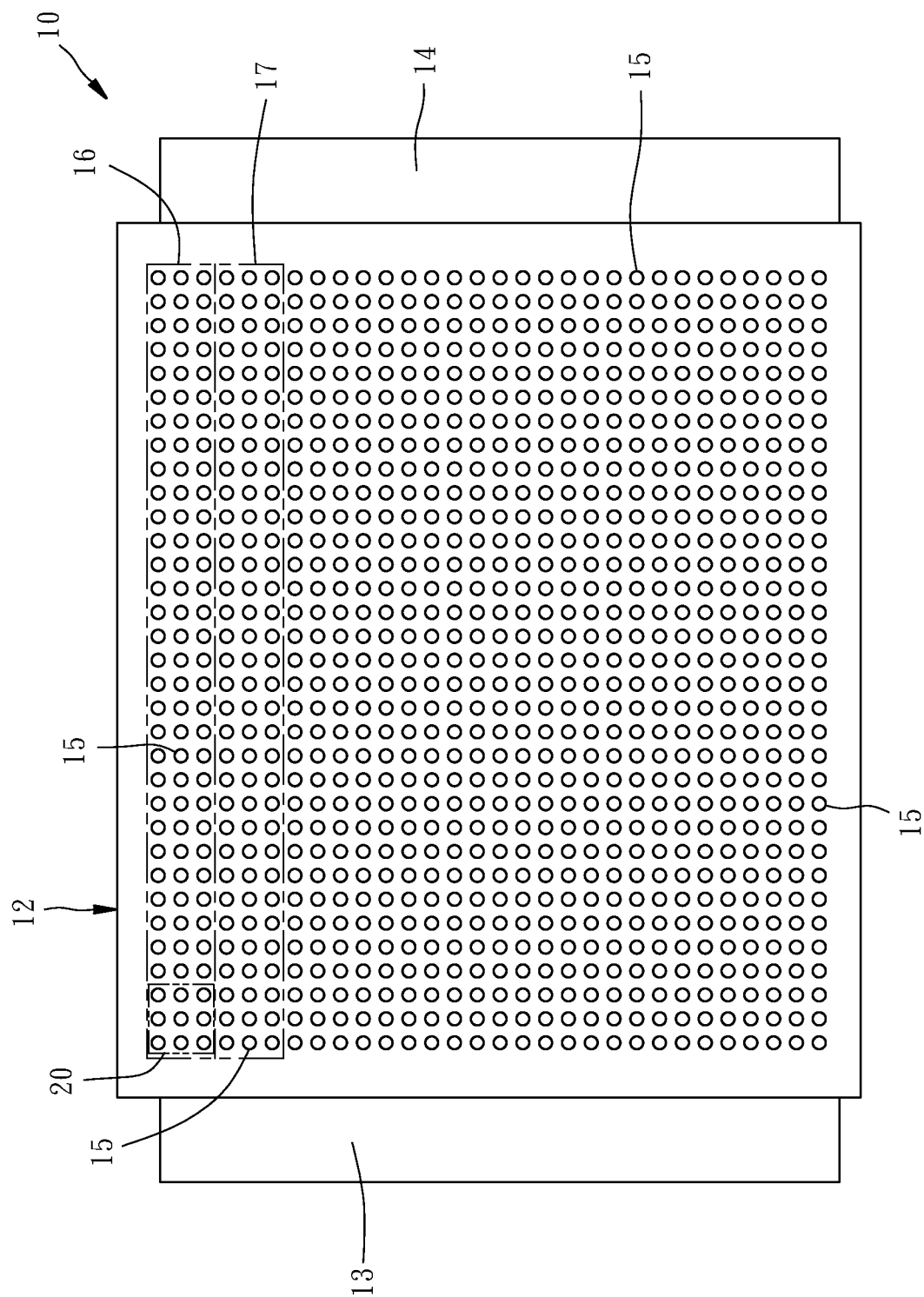
FIG. 1 is a schematic view of a light emitting device in an image processing method according to a preferred embodiment of the present invention.

First of all, it is to be mentioned that same or similar reference numerals used in the following embodiments and the appendix drawings designate same or similar elements or the structural features thereof throughout the specification for the purpose of concise illustration of the present invention. It should be noticed that for the convenience of illustration, the components and the structure shown in the figures are not drawn according to the real scale and amount, and the features mentioned in each embodiment can be applied in the other embodiments if the application is possible in practice. Besides, when it is mentioned that an element is disposed on another element, it means that the former element is directly disposed on the latter element, or the former element is indirectly disposed on the latter element through one or more other elements between aforesaid former and latter elements. When it is mentioned that an element is directly disposed on another element, it means that no other element is disposed between aforesaid former and latter elements.

Figure 2:
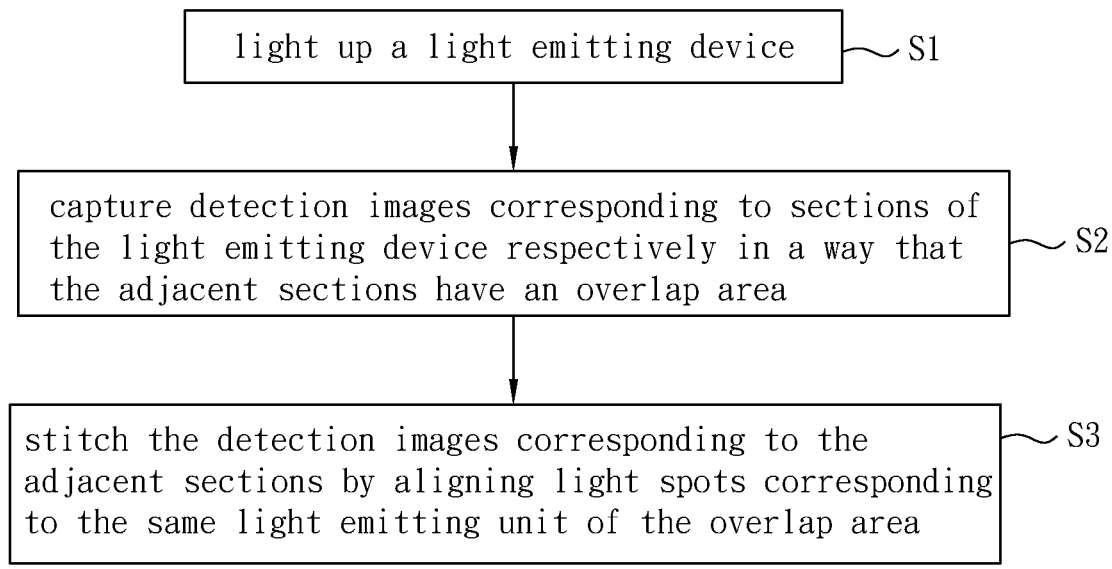
FIG. 2 is a flow diagram of the image processing method for the light emitting units of the light emitting device according to the preferred embodiment of the present invention.
Figure 3:
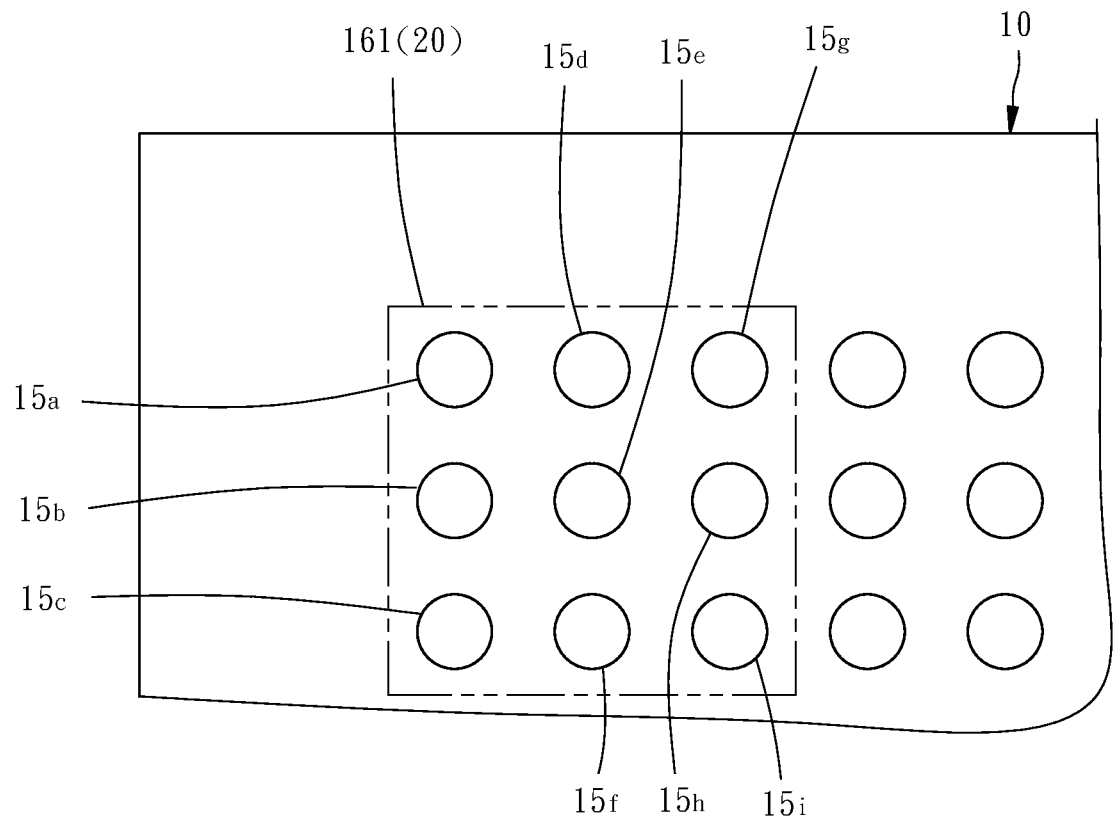
FIG. 3 and FIG. 4 are partially enlarged views of the light emitting device, showing a part of the steps of the image processing method for the light emitting units of the light emitting device according to the preferred embodiment of the present invention.
Figure 4:
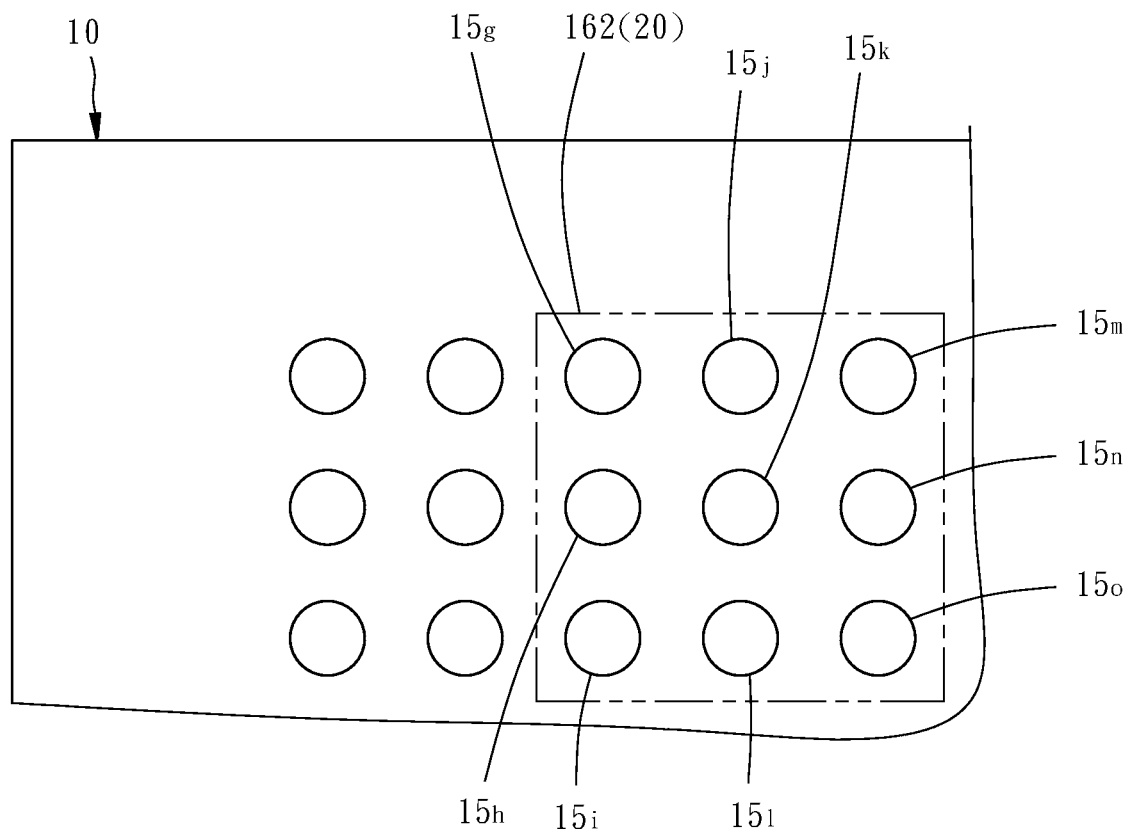

Referring to FIG. 1, an image processing method (as shown in FIG. 2) for a light emitting device 10 according to a preferred embodiment of the present invention is primarily applied to the light distribution detection of the light emitting device 10. The light emitting device 10 includes a main body 12, and positive and negative electrodes 13 and 14. The main body 12 is provided thereon with a plurality of light emitting units 15, including the light emitting units 15a to 15o as shown in FIG. 3 and FIG. 4. Alternatively, the electrodes 13 and 14 may be both positive electrodes, and the negative electrode is provided on the back surface of the light emitting device 10 on the condition that the front surface is that provided with the light emitting units 15. The light emitting device 10 may, but unlimited to, be a light emitting element such as a VCSEL chip having a plurality of light outputting holes or a micro LED array chip having a plurality of micro LEDs. The light emitting units 15 on the main body 12 are the smallest units of the light emitting element for emitting light, i.e. the light outputting holes of the VCSEL chip or the light emit portions of the micro LEDs, which are usually hundreds or thousands in amount and may not be arranged in a regular matrix. For the simplification of the figures and the convenience of illustration, the light emitting units 15 of the light emitting devices 10 drawn for this embodiment are arranged in a regular matrix.

In the present invention, the image processing method for the light emitting device uses an image capturing device (not shown) to capture images of the light emitting units 15 of the light emitting device 10 when they emit light. These captured images are adapted for being observed by the user thereafter. The image capturing device may be a photo camera or video camera, whose photosensitive element is a charge-coupled device (also referred to as 'CCD' hereinafter) or complementary metal-oxide-semiconductor (also referred to as 'CMOS' hereinafter). In order to shoot the light of the light emitting units 15, which is indistinguishable by the naked eye, into images and prevent the to-be-captured light from attenuation due to long distance transmission or from interference by ambient light source, the image capturing device must be located very close to the light emitting device 10 to shoot it. Therefore, as shown in FIG. 1, the visible field of view 20 of the image capturing device is smaller than the distributive range of the light emitting units 15 of the light emitting device 10, which means the field of view 20 only covers a part of the light emitting units 15 of the light emitting device 10. For the simplification of the figures and the convenience of illustration, this embodiment schematically shows that the field of view 20 covers nine light emitting units 15. In practice, the field of view 20 usually covers relatively more light emitting units 15.

The image processing method for the light emitting device includes the following steps.

a) As shown as the step 51 in FIG. 2, the light emitting units 15 of the light emitting device 10 are at least partially lighted up.

Figure 5:
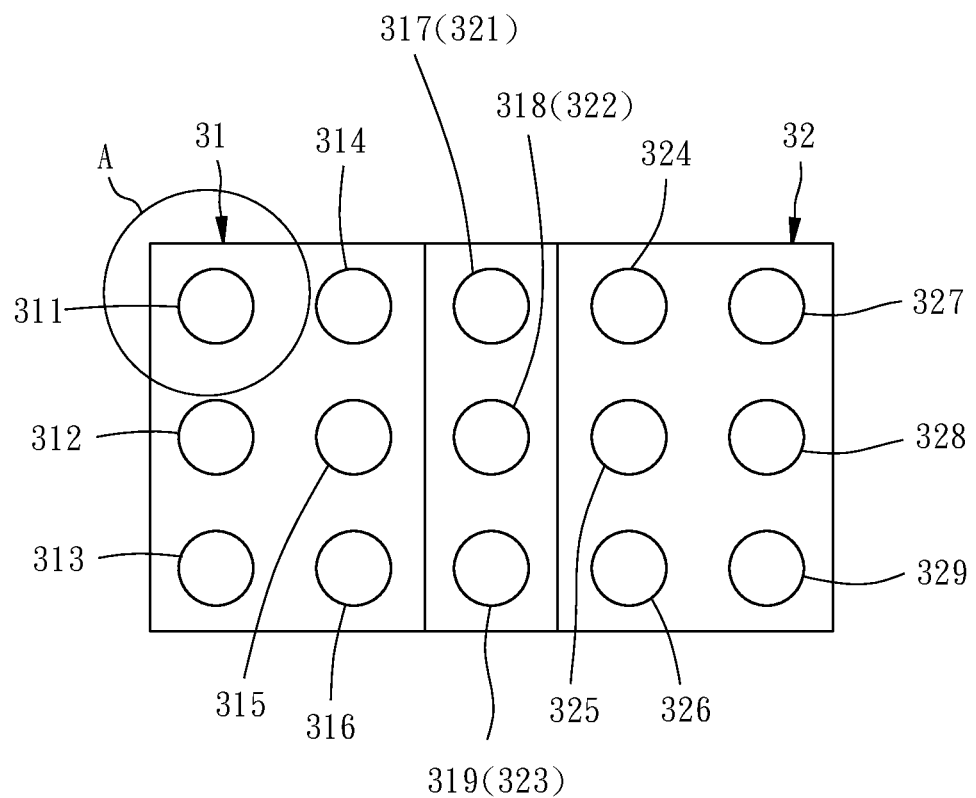
FIG. 5 is a schematic view showing another part of the steps of the image processing method for the light emitting units of the light emitting device according to the preferred embodiment of the present invention.

As described above, the visible field of view 20 of the image capturing device only covers a part of the light emitting units 15 of the light emitting device 10, which means in the following steps, the image capturing device only captures the image of a part of the light emitting units 15 in one time of shooting, e.g. nine light emitting units 15 in this embodiment. Therefore, in this step a), the light emitting units 15 of the light emitting device 10 may be all lighted up at the same time or only partially lighted up. Preferably, in this embodiment, the lighted-up units in this step a) may be only the light emitting units 15 in a first part 16 as shown in FIG. 1, for enabling that the image capturing device can continue shooting from left to right for successively capturing the images of the light emitting units 15 in the first part 16 when they emit light. Alternatively, in every time of shooting, only the light emitting units 15 to be shot are lighted up in that time.

b) As shown as the step S2 in FIG. 2, the image capturing device is used to capture the images of a plurality of sections of the light emitting device 10 respectively, including the sections 161 and 162 as shown in FIG. 3 and FIG. 4, to obtain a plurality of detection images corresponding to the sections respectively, including the detection images 31 and 32 as shown in FIG. 5. Each of the sections includes a plurality of the lighted-up light emitting units 15, e.g. nine light emitting units 15 in this embodiment. Each of the detection images includes a plurality of light spots, e.g. nine light spots in this embodiment, such as the light spots 311-319 or 321-329 as shown in FIG. 5, which respectively correspond to the light emitting units 15 of the associated section from which the detection image is shot. Every two adjacent sections have an overlap area which includes at least one (1-100 or more in practice) of the lighted-up light emitting units 15, the details of which will be described hereunder.

For the section shot by the image capturing device in each time of shooting, when the light emitted from the light emitting units thereof is received by the image capturing device, the photosensitive element of the image capturing device senses light signal, and the light signal is processed by the image capturing device to produce a detection image corresponding to the photosensitive state. In this way, the light of the light emitting units, which is indistinguishable by the naked eye, is shown on the detection image as light spots. The light spot mentioned in the present invention has usually an irregular shape in practice. However, for the simplification of the figures and the convenience of illustration, the light spots in the figures of the present invention are all drawn as circles.

Further speaking, this step b) includes the following sub-steps.

b1) As shown in FIG. 3, make the field of view 20 of the image capturing device cover the first section 161 of the light emitting device 10, such that the first section 161 is shot by the image capturing device and hence a first detection image 31 as shown in FIG. 5 is obtained. The first section 161 includes a plurality of the lighted-up light emitting units, i.e. nine light emitting units 15a to 15i in this embodiment. The first detection image 31 includes a plurality of first light spots 311-319 corresponding to the light emitting units 15a to 15i of the first section 161, respectively.

b2) As shown in FIG. 4, make the field of view 20 of the image capturing device cover the second section 162 of the light emitting device 10, such that the second section 162 is shot by the image capturing device and hence a second detection image 32 as shown in FIG. 5 is obtained. The second section 162 includes a plurality of the lighted-up light emitting units, i.e. nine light emitting units 15g to 15o in this embodiment. The second detection image 32 includes a plurality of second light spots 321-329 corresponding to the light emitting units 15g to 15o of the second section 162, respectively. As shown in FIG. 3 and FIG. 4, the first section 161 and the second section 162 both include the light emitting units 15g to 15i, which means the first section 161 and the second section 162 have an overlap area which includes the light emitting units 15g to 15i.

By the way similar to the aforementioned steps b1) and b2), the image capturing device can continue shooting from left to right, to capture a third detection image (not shown) corresponding to a third section of the light emitting device 10, wherein the third section is located on the right side of the second section 162 and the third section and the second section 162 have an overlap area, and so on. In this way, all the light emitting units 15 in the first part 16 of the light emitting device 10 can be continuously shot, and a plurality of detection images will be obtained.

c) As shown as the step S3 in FIG. 2, the detection images corresponding to the adjacent sections are stitched together in a way that the light spots corresponding to the same light emitting unit 15 of the overlap area are aligned with each other.

Specifically speaking, in the process that the aforementioned first detection image 31 and second detection image 32 are stitched together, several pairs of light spots are taken as alignment reference spots for stitching the first detection image 31 and the second detection image 32. The light spots of the same pair respectively exist in the first detection image 31 and second detection image 32 and correspond to the same light emitting unit 15 of the overlap area. For example, the first light spots 317, 318, 319 and the second light spots 321, 322, 323 pair respectively, and these three pairs correspond to the light emitting units 15g to 15i, respectively. In this way, the first detection image 31 and second detection image 32 are stitched into a single image in a way that the light spots corresponding to each of the light emitting units 15g to 15i of the overlap area of the first and second sections 161 and 162 are superimposed. In other words, as shown in FIG. 5, the first light spots 317, 318 and 319 of the first detection image 31 are superimposed with the second light spots 321, 322 and 323 of the second detection image 32, respectively. By the same way, the other detection images obtained by shooting the first part 16 of the light emitting device 10 and corresponding to the adjacent sections can be continuously stitched rightward. For example, the aforementioned third detection image is stitched to the right side of the second detection image 32, and so on. In this way, the images of the light emitting units 15 in the first part 16 of the light emitting device 10 can be stitched together.

After the images of the first part 16 are captured by the aforementioned steps a) and b), the light emitting units 15 in a second part 17 of the light emitting device 10 as shown in FIG. 1 may be lighted up, and the image capturing way similar to the aforementioned steps b1) and b2) is used to capture detection images corresponding to a plurality of sections of the second part 17 from right to left, and so on, such that the images of all light emitting units 15 of the light emitting device 10 can be obtained. By the aforementioned step c), all detection images can be stitched into a single panoramic image showing all light emitting units 15 of the whole light emitting device 10. It is to be mentioned that in the process that the images of the plurality of sections of the second part 17 are captured, not only the leftward and rightward adjacent detection images have a part having the light spots corresponding to the same light emitting unit 15 and hence being able to serve as the alignment reference spots for stitching the leftward and rightward adjacent detection images, but the detection images corresponding to a certain section of the second part 17 and its upward adjacent section of the first part 16 may also have a part having the light spots corresponding to the same light emitting unit 15 and hence being able to serve as the alignment reference spots for stitching the upward and downward adjacent detection images. In other words, the 'adjacent sections' mentioned in the present invention may be the leftward and rightward adjacent sections or upward and downward adjacent sections.

Further speaking, in the aforementioned process, after the detection images are obtained by the image capturing device, the detection images are transmitted to a storage device (not shown) for storage. Then, the detection images may be post-processed by image processing software, so that the characteristics of each light spot of the detection images, e.g. position, brightness, size, and so on, are obtained and recorded. In the step of stitching the detection images, according to at least one of the aforementioned characteristics of the light spots, it can be determined which light spots correspond to the same light emitting unit 15 and respectively exist in the detection images corresponding to the adjacent sections. In this way, it can be determined which light spots should be superimposed to stitch the detection images accordingly, the details of which will be described hereunder.

Before the light emitting device 10 is lighted up and its images are captured, scanning the whole light emitting device 10 can obtain the positions of all the light emitting units 15, and the coordinate of each light emitting unit 15 can be recorded. In the step of stitching the detection images, according to the positions of the light emitting units obtained by the scanning in advance and the comparison between the position of the field of view 20 in shooting relative to the light emitting device 10 and the positions of the light spots of the detection images relative to the field of view 20, the position (coordinate) of the light emitting unit 15 corresponding to each light spot can be determined. In this way, it can be determined which light spots correspond to the same light emitting unit 15 and respectively exist in the detection images corresponding to the adjacent sections, and these light spots are taken as the alignment reference spots for stitching the detection images.

Figure 6:
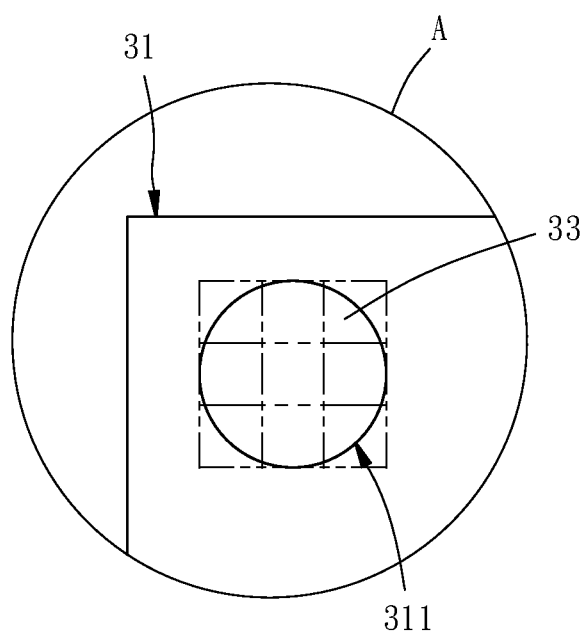
FIG. 6 is an enlarged view of the part A of FIG. 5.

Secondary, the way of obtaining the brightness of each light spot may be post processing every pixel of the detection images by the image processing software to obtain a relative light intensity of every pixel of the detection images, and then calculating the average of the relative light intensities of the pixels occupied by each light spot to obtain a relative light intensity of each light spot, which is also the brightness of each light spot and can represent the light intensity of each light emitting unit 15. For example, the light spot 311 as shown in FIG. 6 occupies nine pixels 33 of the detection image 31. Calculating the average of the relative light intensities of the nine pixels 33 can obtain the relative light intensity of the light spot 311. The light intensity of the light emitting unit 15a can be represented by the relative light intensity of the light spot 311 corresponding to the light emitting unit 15a. For the simplification of the figures, the figures of the present invention only schematically show nine pixels 33 of the detection image 31 by imaginary lines for the convenience of illustration. It is to be mentioned that the relative light intensity mentioned in the present invention is a value calculated by the image processing software for representing the light intensity. The measured relative light intensity of the light spot can be converted into the actual light intensity of the associated light emitting unit according to the comparison between the relative light intensity measured from the image of a standard light source and the physical quantity of the actual light intensity of the standard light source, for example, the unit of which is candela.

For the simplification of the figures, the light spots in the present invention are drawn with identical size. However, the light emitting units 15 of the same light emitting device 10 or light emitting element may have different light emitting area or beam diameter, so the detection image practically has light spots of different sizes. In other words, the size of each light spot represents the light emitting area or beam diameter of the light emitting unit 15 corresponding thereto, which is obtained by the calculation of the number of pixels occupied by each light spot (corresponding to the area of the pixels). The larger the light emitting area or beam diameter of the light emitting unit 15, the larger the light spot corresponding thereto, and the more the pixels it occupies. Therefore, calculating the number of pixels occupied by each light spot can obtain the light emitting area or beam diameter of the light emitting unit 15 corresponding thereto.

In the step of stitching the detection images of every two adjacent sections, according to the physical or optical characteristics of the light spots, such as position, brightness and size as mentioned above, a pair of light spots with corresponding characteristic can be found out in a possible overlap area, e.g. the right part of a detection image and the left part of the next detection image. These light spots respectively exist in two detection images and correspond to the same light emitting unit 15, thereby capable of being taken as the alignment reference spots for stitching the detection images. For example, if the brightness values (or relative light intensities, which may be used instead of the brightness values hereunder) of the light spots 317, 318 and 319 of the detection image 31 are 95, 90 and 85 respectively, it means that these three light spots 317, 318 and 319 have a brightness relativity including differences of 5 between the brightness values thereof. On the other hand, the brightness values of the light spots 321, 322 and 323 of the detection image 32 are 100, 95 and 90 respectively, which means that these three light spots 321, 322 and 323 also have a brightness relativity including differences of 5 between the brightness values thereof. It can be known that the brightness relativity of the light spots 317, 318 and 319 of the detection image 31 matches the brightness relativity of the light spots 321, 322 and 323 of the detection image 32, which means they are the same or similar within a reasonable error range (e.g. 3%). Therefore, it can be determined that the light spots 317, 318 and 319 of the detection image 31 correspond to the same light emitting units, i.e. light emitting units 15g, 15h, 15i, to which the light spots 321, 322 and 323 of the detection image 32 correspond respectively, because the light spots included in the adjacent detection images and correspond to the same light emitting units should have same or extremely similar brightness relativity. In other words, by comparing the brightness relativity between a plurality of light spots, e.g. differences between the brightness values of the light spots, to determine whether they match each other, three pairs of light spots, i.e. the light spots 317, 318 and 319 and the light spots 321, 322 and 323, are determined that these three pairs correspond to the light emitting units 15g, 15h and 15i respectively, wherein the light spots of the same pair correspond to the same light emitting unit and respectively exist in the detection image 31 and the detection image 32. Therefore, the light spots 317, 318 and 319 and the light spots 321, 322 and 323 are taken as the alignment reference spots for stitching the detection image 31 and the detection image 32 together in a way that the light spots 317, 318 and 319 are positionally superimposed with the light spots 321, 322 and 323 respectively, such that the detection image 31 and the detection image 32 are stitched into a single image corresponding to all the light emitting units 15 of the first and second sections 161 and 162. Likewise, by comparing the size relativity of a plurality of light spots, e.g. differences between the sizes of the light spots, to determine whether they are the same or similar, it can be determined which light spots are produced by the same light emitting unit 15 and exist in the adjacent detection images respectively, and these light spots can be taken as the alignment reference spots for stitching the detection images.

In theory, the brightness values calculated from different detection images for the same light emitting unit 15 should be the same. But in practice, taking the above embodiment as an example, the brightness values calculated from the light spots included in different detection images and corresponding to the same light emitting unit 15 may have a certain deviation therebetween, which means the light spots in one of the detection images are all deviated in brightness value thereof for a same specific value, so that the light spots included in two stitched detection images and corresponding to the same light emitting unit 15 have different brightness values, thereby unable to be combined correspondingly. In such condition, the brightness values of all light spots of at least one of the detection images can be compensatively corrected by being all increased or decreased the aforementioned deviation, so that when different detection images are stitched into a single image, all light spots have the same brightness reference value. Therefore, the step of stitching the detection images together in the present invention may include a sub-step of adjusting the brightness values of the light spots of at least a part of the detection images to make the brightness values of the superimposed light spots in the stitched images equal to each other. For the aforementioned example, when superimposing the light spots 317, 318 and 319 of the detection image 31, whose brightness values are 95, 90 and 85, with the light spots 321, 322 and 323 of the detection image 32, whose brightness values are 100, 95 and 90, the brightness values of all light spots 321-329 of the detection image 32 can be decreased by 5, so that the brightness values of the light spots 321, 322 and 323 are adjusted to 95, 90 and 85 respectively, the same with the brightness values of the light spots 317, 318 and 319. In this way, the deviation of measurement is prevented from existing between the brightness values of all light emitting units 15 of the second section 162 and the brightness values of all light emitting units 15 of the first section 161 after their corresponding detection images are stitched together.

In the aforementioned example, the brightness values of the light spots are adjusted according to the difference between the brightness values of two light spots superimposed with each other. However, the adjustment may be performed according to the ratio of the brightness values of two light spots superimposed with each other. Specifically speaking, one of the light emitting units 15 of the overlap area may be chosen to be a reference light emitting unit. For example, the light emitting unit 15g may be taken as the reference light emitting unit. After the ratio or difference between the brightness values of the light spots corresponding to the reference light emitting unit 15g, i.e. the first light spot 317 and the second light spot 321, is obtained, the brightness values of all second light spots 321-329 are adjusted according to the aforementioned ratio or difference.

The aforementioned example takes the difference between the brightness values of the light spots, not the brightness values of the light spots, as the characteristic for determining which light spots correspond to the same light emitting unit 15 and exist in two detection images respectively so as to take these duplicate light spots as the alignment reference spots for stitching the detection images. Such way can prevent the problem of directly taking the brightness values of the light spots as the characteristic that if two adjacent images have a measurement deviation in brightness, it can't be determined which light spots correspond to the same light emitting unit 15 and exist in two detection images respectively because the light spots corresponding to the same light emitting unit and included in different detection images have different brightness value. However, the present invention is unlimited to take the difference between the brightness values of the light spots as the characteristic for the determination. For example, if two detection images have no or insignificant measurement deviation in brightness, the brightness values of the light spots can be directly taken as the characteristic for the determination. In addition, it is unlimited to take one of the position, brightness and size of the light spots as the characteristic for the determination, but may take two or three of the position, brightness and size of the light spots as the characteristics for the determination at the same time.

It is to be mentioned that for making the detection images and the single panoramic image that is generated by stitching the detection images clearly show the light spots corresponding to respective light emitting units 15, the aforementioned relative light intensity of each light spot, which is obtained from post processing the detection image, should be within an acceptable relative light intensity range. However, if the light emitting units 15 of the light emitting device 10 under test emit light having high light intensity, it may cause overexposure to the detection image, thereby making the measured relative light intensities of the light spots mostly out of the acceptable relative light intensity range. In such circumstance, when the image capturing device captures the images of the sections of the light emitting device 10 respectively, a filtering element (not shown), e.g. filter lens, may be used to filter the light emitted from the light emitting units 15 of the light emitting device 10 to make the measured relative light intensities of the light spots all fall within the acceptable relative light intensity range or all unsaturated, or make at least a predetermined proportion (e.g. 90%) of the light spots have relative light intensities falling within the acceptable relative light intensity range. That means the filtering element is arranged optionally.

In summary, by the image processing method for the light emitting device of the present invention, the images of the same light emitting device, which are captured successively, can be stitched together to form a single panoramic image, so that the light emitting statuses of all light emitting units of the same light emitting device are presented on the single panoramic image, thereby facilitating the user's observation of the light distributive status of the light emitting device.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image processing method for a light emitting device, which uses an image capturing device to capture images of a plurality of light emitting units of the light emitting device; wherein a field of view of the image capturing device is smaller than a distributive range of the light emitting units of the light emitting device; the image processing method comprising the steps of:

lighting up at least a part of the light emitting units of the light emitting device;

using the image capturing device to capture images of a plurality of sections of the light emitting device respectively to obtain a plurality of detection images corresponding to the sections respectively; wherein each of the sections comprises a plurality of the lighted-up light emitting units; each of the detection images comprises a plurality of light spots respectively corresponding to the light emitting units of associated said section; every two adjacent said sections have an overlap area; the overlap area comprises at least one of the lighted-up light emitting units; and stitching the detection images corresponding to the adjacent sections together by taking the light spots corresponding to the at least one of the lighted-up light emitting units of the overlap area as alignment reference spots.

2. The image processing method as claimed in claim 1, wherein in the step of stitching the detection images, according to at least one of position, brightness and size of the light spots, at least one pair of said light spots, which respectively exist in the detection images corresponding to the adjacent sections and correspond to the same light emitting unit of the overlap area, is determined to serve as the alignment reference spots.

3. The image processing method as claimed in claim 2, wherein in the step of stitching the detection images, according to brightness relativity of the light spots, a plurality of pairs of said light spots, in which the light spots of each of the pairs of said light spots respectively exist in the detection images corresponding to the adjacent sections and correspond to the same light emitting unit of the overlap area, are determined to serve as the alignment reference spots.

4. The image processing method as claimed in claim 3, wherein the brightness relativity of the light spots comprises differences between brightness values of the light spots.

5. The image processing method as claimed in claim 4, wherein the step of stitching the detection images comprises a sub-step of adjusting the brightness values of the light spots of at least a part of the detection images to make the difference between the brightness values of the alignment reference spots, which are included in the detection images corresponding to the adjacent sections and correspond to the same light emitting unit, smaller than a predetermined value.

6. The image processing method as claimed in claim 5, wherein a way of adjusting the brightness values of the light spots is to choose one of the light emitting units of the overlap area to be a reference light emitting unit, obtain one of a ratio and the difference between the brightness values of two said light spots corresponding to the reference light emitting unit and included in the detection images corresponding to the adjacent sections, and adjust the brightness values of all the light spots of at least one of the associated detection images according to said one of the ratio and the difference.

7. The image processing method as claimed in claim 2, wherein in the step of stitching the detection images, according to brightness values of the light spots, a plurality of pairs of said light spots, in which the light spots of each of the pair of said light spots respectively exist in the detection images corresponding to the adjacent sections and correspond to the same light emitting unit of the overlap area, are determined to serve as the alignment reference spots.

8. The image processing method as claimed in claim 1, wherein the step of using the image capturing device to capture the images of the plurality of sections of the light emitting device comprises a sub-step of filtering light emitted from the light emitting units of the light emitting device.

9. An image processing method for a light emitting device, which uses an image capturing device to capture images of a plurality of light emitting units of the light emitting device; wherein a field of view of the image capturing device is smaller than a distributive range of the light emitting units of the light emitting device; the image processing method comprising the steps of:

lighting up at least a part of the light emitting units of the light emitting device;

making the field of view of the image capturing device cover a first section of the light emitting device to shoot the first section by the image capturing device so as to obtain a first detection image; wherein the first section comprises a plurality of the lighted-up light emitting units; the first detection image comprises a plurality of first light spots respectively corresponding to the light emitting units of the first section;

making the field of view of the image capturing device cover a second section of the light emitting device to shoot the second section by the image capturing device so as to obtain a second detection image; wherein the second section comprises a plurality of the lighted-up light emitting units; the second detection image comprises a plurality of second light spots respectively corresponding to the light emitting units of the second section; the first section and the second section have an overlap area; the overlap area comprises at least one of the lighted-up light emitting units; and according to at least one of position, brightness and size of the first and second light spots, determining at least one pair of said first and second light spots respectively existing in the first and second detection images and corresponding to the same light emitting unit, and stitching the first and second detection images together by taking said at least one pair of said first and second light spots as alignment reference spots.

10. The image processing method as claimed in claim 9, wherein in the step of stitching the first and second detection images, according to brightness relativity of the first and second light spots, a plurality of pairs of said first and second light spots, in which the first and second light spots of each of the pairs of said first and second light spots respectively exist in the first and second detection images and correspond to the same light emitting unit, are determined to serve as the alignment reference spots.

11. The image processing method as claimed in claim 10, wherein the brightness relativity of the first and second light spots comprises differences between brightness values of the first and second light spots.

12. The image processing method as claimed in claim 11, wherein the step of stitching the first and second detection images comprises a sub-step of adjusting the brightness values of the second light spots to make the difference between the brightness values of the alignment reference spots, which are included in the first and second detection images and correspond to the same light emitting unit, smaller than a predetermined value.

13. The image processing method as claimed in claim 12, wherein a way of adjusting the brightness values of the second light spots is to choose one of the light emitting units of the overlap area to be a reference light emitting unit, obtain one of a ratio and the difference between the brightness values of the first and second light spots included in the first and second detection images and corresponding to the reference light emitting unit, and adjust the brightness values of the second light spots according to said one of the ratio and the difference.

14. The image processing method as claimed in claim 9, wherein in the step of stitching the first and second detection images, according to brightness values of the first and second light spots, a plurality of pairs of said first and second light spots, in which the first and second light spots of each of the pairs of said first and second light spots respectively exist in the first and second detection images and correspond to the same light emitting unit, are determined to serve as the alignment reference spots.

15. The image processing method as claimed in claim 9, wherein each of the step of shooting the first section and the step of shooting the second section comprises a sub-step of filtering light emitted from the light emitting units of the light emitting device.

\* \* \* \* \*